United States Patent
Shin et al.

(10) Patent No.: US 11,429,214 B2
(45) Date of Patent: Aug. 30, 2022

(54) DISPLAY DEVICE WITH TOUCH STRUCTURE AND METHOD OF FORMING THE SAME

(71) Applicant: LG Display Co., Ltd., Seoul (KR)

(72) Inventors: Young-Sub Shin, Goyang-si (KR); Byong-Hoo Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/100,791

(22) Filed: Nov. 20, 2020

(65) Prior Publication Data

US 2021/0072855 A1    Mar. 11, 2021

Related U.S. Application Data

(62) Division of application No. 16/132,811, filed on Sep. 17, 2018, now Pat. No. 10,884,530.

(30) Foreign Application Priority Data

Sep. 27, 2017 (KR) .................. 10-2017-0125508

(51) Int. Cl.
*G06F 3/041* (2006.01)
*H01L 51/52* (2006.01)
(Continued)

(52) U.S. Cl.
CPC .......... *G06F 3/0412* (2013.01); *G06F 3/0443* (2019.05); *G06F 3/0445* (2019.05);
(Continued)

(58) Field of Classification Search
CPC .... G06F 3/0412; G06F 3/0446; G06F 3/0443; G06F 2203/04111; G06F 2203/04103;
(Continued)

(56) References Cited

U.S. PATENT DOCUMENTS 9,711,750 B1 * 7/2017 Kim .................. H01L 27/3258
10,211,264 B2 * 2/2019 Lee .................. H01L 27/3246
(Continued)

FOREIGN PATENT DOCUMENTS

CN    103164094 A    6/2013
CN    103430134 A    12/2013
(Continued)

OTHER PUBLICATIONS

Korean Office Action dated Jul. 1, 2021, issued in corresponding Korean Patent Application No. 10-2017-0125508.
(Continued)

*Primary Examiner* — Amy Onyekaba
(74) *Attorney, Agent, or Firm* — Morgan, Lewis & Bockius LLP (57) ABSTRACT

A display device and method of forming the same are provided. A display device includes: an encapsulating structure between a device substrate and a cover substrate, a light-emitting element between the device substrate and the encapsulating structure, the light-emitting element including: a first electrode, a light-emitting layer, and a second electrode, which are sequentially stacked, a touch structure between the encapsulating structure and the cover substrate, the touch structure including: a first bridge electrode, a touch insulating layer, and a second bridge electrode, which are sequentially stacked, and a reflecting prevention layer between the first bridge electrode and the touch insulating layer.

13 Claims, 10 Drawing Sheets

(51) Int. Cl.
  *H01L 51/56* (2006.01)
  *G06F 3/044* (2006.01)
  *H01L 27/32* (2006.01)
  *H01L 51/50* (2006.01)
(52) U.S. Cl.
  CPC .......... *G06F 3/0446* (2019.05); *H01L 27/322* (2013.01); *H01L 27/323* (2013.01); *H01L 27/3258* (2013.01); *H01L 27/3262* (2013.01); *H01L 27/3272* (2013.01); *H01L 51/5012* (2013.01); *H01L 51/5237* (2013.01); *H01L 51/56* (2013.01); *G06F 2203/04103* (2013.01); *G06F 2203/04111* (2013.01)
(58) Field of Classification Search
  CPC ... H01L 27/3262; H01L 27/323; H01L 51/56; H01L 27/3272; H01L 51/5012; H01L 51/5237; H01L 27/322; H01L 27/3258; H01L 51/5253; H01L 21/0276
  See application file for complete search history.

(56) References Cited

U.S. PATENT DOCUMENTS

| | | | | |
|---|---|---|---|---|
| 2009/0085885 | A1* | 4/2009 | Wu | G06F 3/0416 345/173 |
| 2009/0250690 | A1* | 10/2009 | Shin | H01L 27/283 257/40 |
| 2011/0031492 | A1* | 2/2011 | Yamazaki | H01L 27/1255 257/E29.296 |
| 2011/0037068 | A1* | 2/2011 | Yamazaki | H01L 29/78603 257/E29.296 |
| 2011/0267290 | A1* | 11/2011 | Park | G06F 3/0443 345/173 |
| 2012/0146032 | A1* | 6/2012 | Lee | H01L 27/14 257/40 |
| 2013/0001564 | A1* | 1/2013 | Choi | H01L 29/66765 257/40 |
| 2013/0038571 | A1* | 2/2013 | Ho | G06F 3/0446 29/846 |
| 2013/0153915 | A1* | 6/2013 | Choi | H01L 51/5265 257/89 |
| 2013/0155011 | A1 | 6/2013 | Kim et al. | |
| 2013/0175533 | A1* | 7/2013 | Lee | H01L 27/3248 257/66 |
| 2013/0271689 | A1* | 10/2013 | Kim | G06F 3/0446 349/110 |
| 2014/0022467 | A1 | 1/2014 | Chai et al. | |
| 2014/0027726 | A1* | 1/2014 | Choi | H01L 27/3211 438/34 |
| 2014/0042397 | A1* | 2/2014 | Cho | H01L 27/3244 257/40 |
| 2014/0054555 | A1* | 2/2014 | Kim | H01L 27/322 438/23 |
| 2014/0055440 | A1* | 2/2014 | Cho | G09G 3/36 345/212 |
| 2014/0145179 | A1* | 5/2014 | Yoon | H01L 29/66969 438/151 |
| 2014/0166998 | A1* | 6/2014 | Lee | H01L 27/323 257/40 |
| 2014/0340364 | A1* | 11/2014 | Tang | G06F 3/042 345/175 |
| 2015/0115253 | A1* | 4/2015 | Ha | H01L 27/3211 438/23 |
| 2015/0146144 | A1* | 5/2015 | Yang | G02F 1/133512 349/106 |
| 2015/0169105 | A1* | 6/2015 | Tung | G06F 3/0446 427/79 |
| 2015/0185915 | A1 | 7/2015 | Lim | |
| 2015/0212539 | A1* | 7/2015 | Hong | G06F 3/0445 345/174 |
| 2016/0011703 | A1* | 1/2016 | Park | G06F 3/0445 345/174 |
| 2016/0034072 | A1* | 2/2016 | Yang | G06F 3/0412 345/173 |
| 2016/0093827 | A1* | 3/2016 | Han | H01L 27/3244 257/40 |
| 2016/0103549 | A1* | 4/2016 | Lee | G06F 3/0412 345/173 |
| 2016/0124557 | A1* | 5/2016 | Choi | G06F 1/1626 345/173 |
| 2016/0163769 | A1* | 6/2016 | Lee | H01L 27/3272 438/23 |
| 2016/0190456 | A1* | 6/2016 | You | H01L 51/5203 257/40 |
| 2016/0247870 | A1* | 8/2016 | Park | H01L 51/5234 |
| 2016/0252989 | A1* | 9/2016 | Zhang | G06F 3/041 345/173 |
| 2016/0253026 | A1* | 9/2016 | Long | G03F 7/20 345/174 |
| 2016/0282987 | A1* | 9/2016 | Choi | G06F 3/0446 |
| 2016/0307971 | A1 | 10/2016 | Jeon | |
| 2016/0351631 | A1* | 12/2016 | Lee | H01L 51/5293 |
| 2017/0040553 | A1* | 2/2017 | Watabe | H01L 51/5028 |
| 2017/0069692 | A1* | 3/2017 | Lee | G06F 3/0412 |
| 2017/0125500 | A1* | 5/2017 | Kim | H01L 27/3265 |
| 2017/0141169 | A1* | 5/2017 | Sim | H01L 27/3258 |
| 2017/0147116 | A1 | 5/2017 | Lee et al. | |
| 2017/0154934 | A1* | 6/2017 | Kim | H01L 27/3258 |
| 2017/0179205 | A1* | 6/2017 | Kim | H01L 27/3213 |
| 2017/0213872 | A1* | 7/2017 | Jinbo | H01L 51/5246 |
| 2017/0262109 | A1* | 9/2017 | Choi | H01L 27/3258 |
| 2017/0278899 | A1* | 9/2017 | Yang | G06F 3/0412 |
| 2017/0278900 | A1* | 9/2017 | Yang | H01L 27/3272 |
| 2017/0288007 | A1* | 10/2017 | Shin | G02F 1/1345 |
| 2018/0031893 | A1* | 2/2018 | Tamaki | G06F 3/1446 |
| 2018/0032193 | A1* | 2/2018 | Qu | G02F 1/13338 |
| 2018/0095566 | A1 | 4/2018 | Lee et al. | |
| 2018/0095574 | A1* | 4/2018 | Kim | G06F 3/04144 |
| 2018/0136748 | A1* | 5/2018 | Li | G06F 3/041 |
| 2019/0087034 | A1* | 3/2019 | Dai | G06F 3/0445 |
| 2019/0103443 | A1* | 4/2019 | Kim | G06F 3/0412 |
| 2019/0103575 | A1* | 4/2019 | Park | H01L 51/5096 |
| 2020/0333916 | A1* | 10/2020 | Zhang | G06F 3/0443 |

FOREIGN PATENT DOCUMENTS

| CN | 103885659 A | 6/2014 |
|---|---|---|
| CN | 104520791 A | 4/2015 |
| CN | 105575998 A | 5/2016 |
| CN | 106057853 A | 10/2016 |
| CN | 107077261 A | 8/2017 |
| KR | 10-2009-0058072 A | 6/2009 |
| KR | 10-2015-0078337 A | 7/2015 |
| KR | 10-2016-0114780 A | 10/2016 |
| KR | 10-2017-0081006 A | 7/2017 |

OTHER PUBLICATIONS

Office Action dated Dec. 25, 2020, issued in corresponding Chinese Patent Application No. 201811119786.3.

Notification of First Office Action dated Jun. 3, 2020, issued in corresponding Chinese Patent Application No. 201811119786.3.

\* cited by examiner

DISPLAY DEVICE WITH TOUCH STRUCTURE AND METHOD OF FORMING THE SAME

CROSS-REFERENCE TO RELATED APPLICATION(S)

This application is a divisional of U.S. patent application Ser. No. 16/132,811, filed on Sep. 17, 2018, which claims the benefit of and priority to Korean Patent Application No. 10-2017-0125508, filed on Sep. 27, 2017, the entirety of each of which is hereby incorporated by reference.

BACKGROUND

1. Technical Field

The present disclosure relates to a display device with a touch structure and a method of forming the same, and more particularly, to a display device including a touch structure for detecting a location of a region that a user's hand or tool may contact.

2. Discussion of the Related Art

Generally, a display device includes a display panel that realizes an image. For example, the display device may include a liquid crystal panel having a liquid crystal, and/or an OLED panel having an organic light-emitting element.

The display device may drive a particular program or input a particular signal according to a location of a region that a user's hand or tool may contact. For example, the display device may include a touch structure on the display panel. The display panel may include a light-emitting element. For example, the display device may have a structure in which the light-emitting element and the touch structure are sequentially stacked between a device substrate and a cover substrate.

The touch structure may include touch electrodes for detecting the location of the region that a user's hand or tool may contact, and bridge electrodes connecting between the touch electrodes. For example, the touch structure may include first touch electrodes, second touch electrodes between the first touch electrodes, first bridge electrodes connecting between the first touch electrodes in a first direction, and second bridge electrodes connecting between the second touch electrodes in a second direction perpendicular to the first direction. The second bridge electrodes may intersect the first bridge electrodes. For example, the first bridge electrodes may be on a layer different from the first touch electrodes, the second touch electrodes, and the second bridge electrodes.

The first touch electrodes may be insulated from the first touch electrodes, the second touch electrodes, and the second bridge electrodes by a touch insulating layer. The touch insulating layer may include touch contact holes exposing a portion of each first bridge electrode. Each of the first touch electrodes may be connected to the first bridge electrode closest thereto in the first direction by the corresponding touch contact hole of the touch insulating layer.

The operation of forming the touch contact holes in the touch insulating layer may include a photolithography process. However, light used in the photolithography process may be reflected by the first bridge electrodes. That is, when the light irradiated to form the touch contact holes is reflected by the first bridge electrodes, the exposure of un-design regions (e.g., regions that are not part of the intended design) may occur in the photolithography process. For example, the display device may include the touch contact hole that does not completely penetrate the touch insulating layer. Thus, in the display device, the connection between the first touch electrodes and the first bridge electrodes may become unstable.

SUMMARY

Accordingly, the present disclosure is directed to a display device with a touch structure and a method of forming the same that substantially obviate one or more of the issues due to limitations and disadvantages of the related art.

An aspect of the present disclosure is to provide a display device in which a first touch electrode is stably connected to a first bridge electrode by a touch contact hole of a touch insulating layer.

Another aspect of the present disclosure is to provide a stereoscopic display device capable of reducing or preventing the exposure of un-design regions (e.g., regions that are not part of the intended design) of a touch insulating layer due to a first bridge electrode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: an encapsulating structure between a device substrate and a cover substrate, a light-emitting element between the device substrate and the encapsulating structure, the light-emitting element including: a first electrode, a light-emitting layer, and a second electrode, which are sequentially stacked, a touch structure between the encapsulating structure and the cover substrate, the touch structure including: a first bridge electrode, a touch insulating layer, and a second bridge electrode, which are sequentially stacked, and a reflecting prevention layer between the first bridge electrode and the touch insulating layer.

In another aspect, there is provided a display device, including: a light-emitting element, an encapsulating structure on the light-emitting element, a first bridge electrode on the encapsulating layer, a reflecting prevention layer on the first bridge electrode, a touch insulating layer on the reflecting prevention layer, the touch insulating layer including a touch contact hole exposing a portion of the first bridge electrode, the touch contact hole penetrating the reflecting prevention layer, a first touch electrode on the touch insulating layer, the first touch electrode being connected to the first bridge electrode through the touch contact hole, and a second bridge electrode on the touch insulating layer, the second bridge electrode being spaced apart from the first touch electrode.

In another aspect, there is provided a method of forming a display device, the method including: forming a display buffer layer on a device substrate, forming a thin film transistor on the display buffer layer, forming a lower passivation layer on the thin film transistor, forming an overcoat layer on the lower passivation layer, forming a first electrode to be electrically coupled to the thin film transistor, forming the bank insulating layer to be covering an edge of the first electrode, such that a portion of the first electrode is exposed by the bank insulating layer, forming a light-emitting element by stacking a light-emitting layer and a second electrode on the portion of the first electrode that is exposed by the bank insulating layer, forming an encapsulating structure on the second electrode, forming a first bridge electrode on the encapsulating structure, and forming a reflecting prevention layer on the first bridge electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, example embodiments of the present disclosure will be described in detail with reference to the accompanying drawings.

Figure 1:
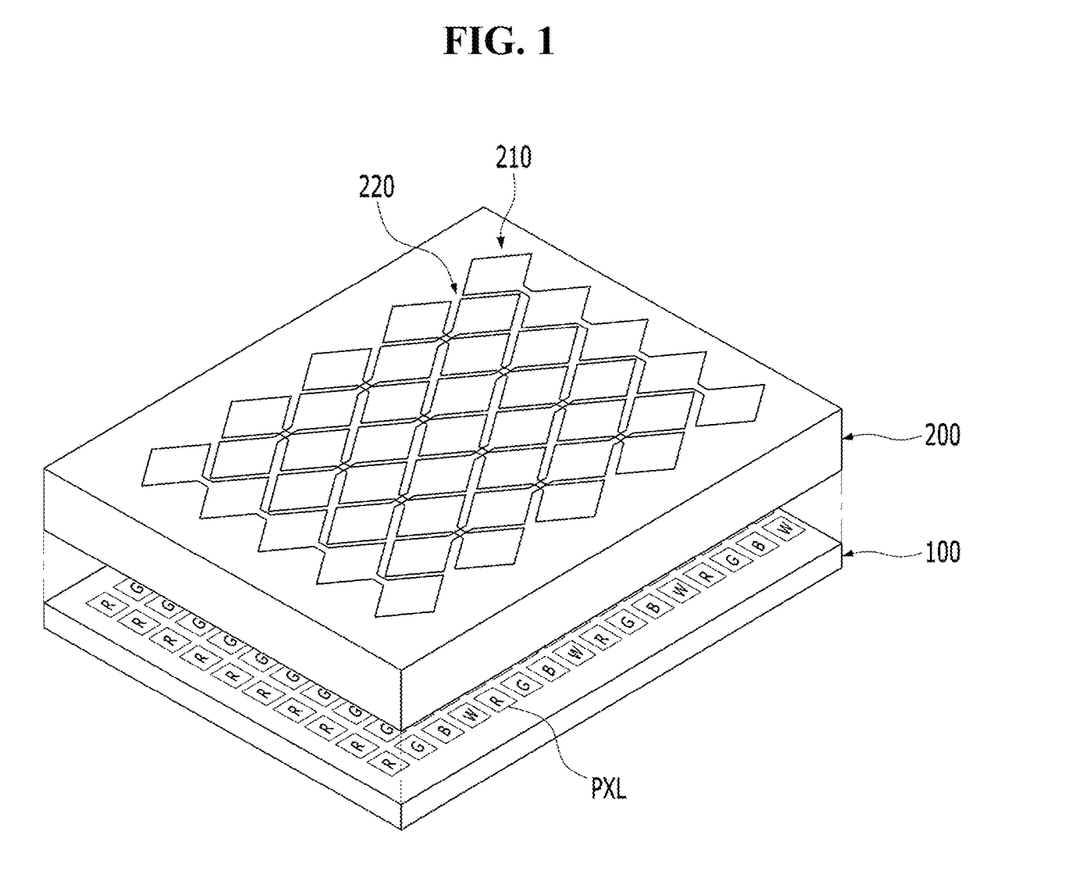
FIG. 1 is a view illustrating a display device according to an embodiment of the present disclosure.
Figure 2:
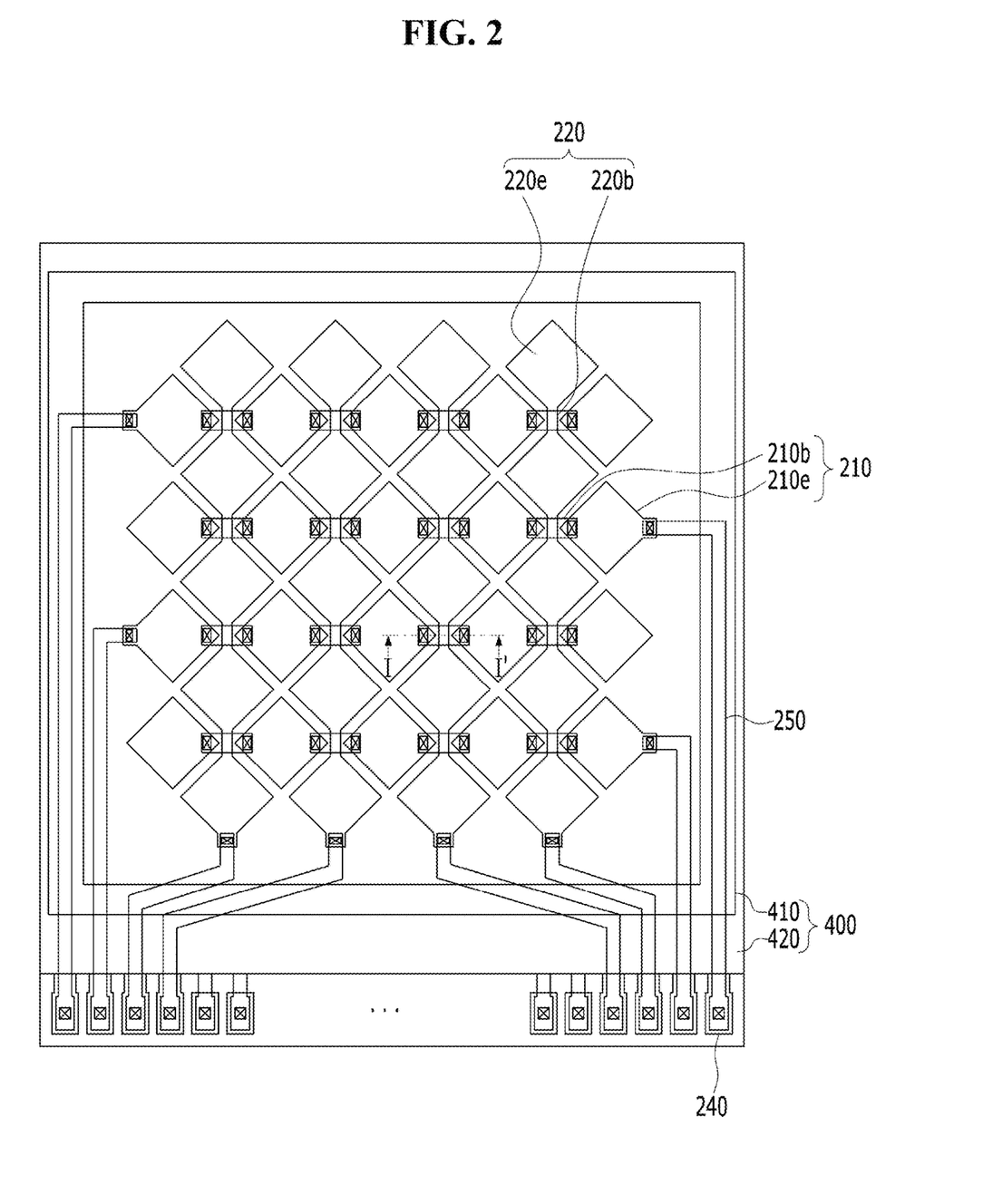
FIG. 2 is a top view of a display device according to an example embodiment of the present disclosure.
Figure 3:
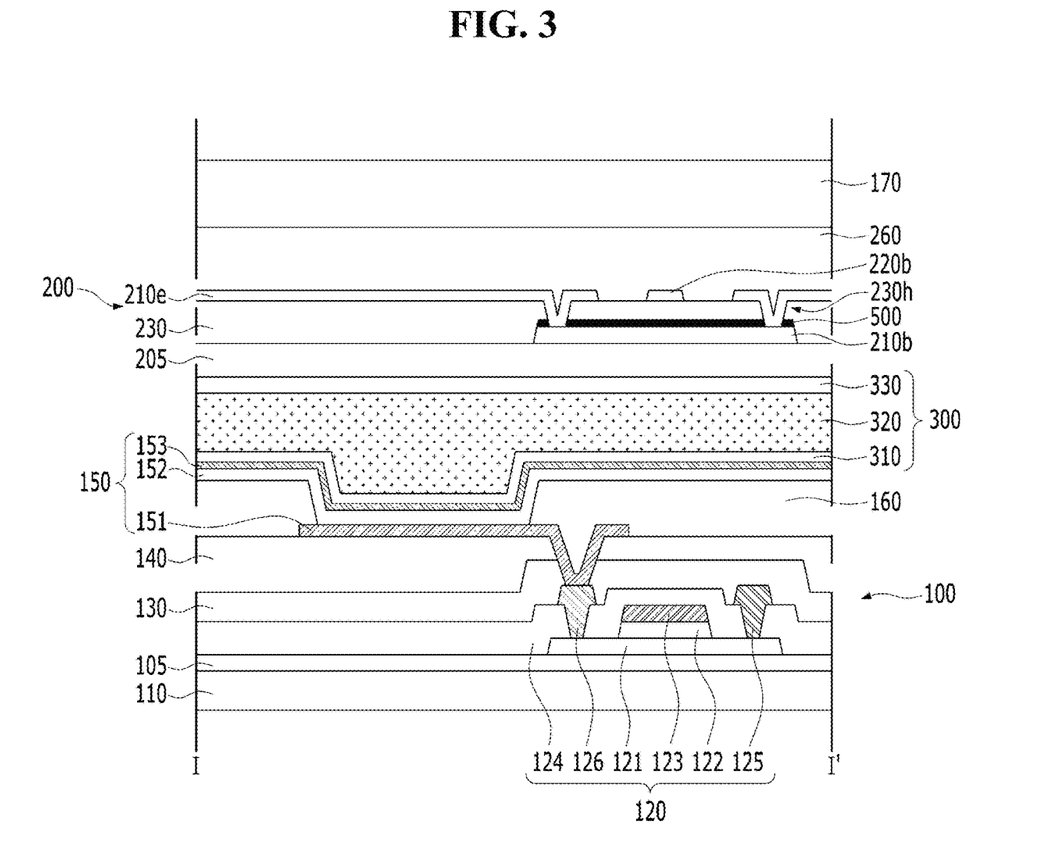
FIG. 3 is a view taken along line I-I' of FIG. 2.

FIG. 1 is a view illustrating a display device according to an embodiment of the present disclosure. FIG. 2 is a top view of a display device according to an example embodiment of the present disclosure. FIG. 3 is a view taken along line I-I' of FIG. 2.

With reference to FIGS. 1 to 3, the display device according to an embodiment of the present disclosure may include a display panel 100. The display panel 100 may realize an image that may be provided to a user. The display panel 100 may include a plurality of pixels PXL. Each of the pixels PXL may emit light displaying a particular color. For example, the display panel 100 may include a red pixel R that may emit light displaying red color, a green pixel G that may emit light displaying green color, a blue pixel B that may emit light displaying blue color, and a white pixel W that may emit light displaying white color.

A light-emitting element 150 may be in each pixel PXL. The light-emitting element 150 may generate light displaying a particular color. For example, the light-emitting element 150 may include a first electrode 151, a light-emitting layer 152, and a second electrode 153, which may be sequentially stacked.

The first electrode 151 may include a conductive material. The first electrode 151 may include a material having high reflectance. For example, the first electrode 151 may include a metal, such as aluminum (Al) and/or silver (Ag). The first electrode 151 may have a multi-layer structure. For example, the first electrode 151 may have a structure in which a reflective electrode including a high-reflectance material may be between transparent electrodes including a transparent material, such as indium tin oxide (ITO) and/or indium zinc oxide (IZO). Embodiments are not limited to these examples.

The light-emitting layer 152 may generate light having luminance corresponding to a voltage difference between the first electrode 151 and the second electrode 153. For example, the light-emitting layer 152 may include an emission material layer (EML) including an emission material. The emission material may include an organic material, an inorganic material, and a hybrid material. For example, the display device according to an example embodiment of the present disclosure may be an organic light-emitting display device including the light-emitting layer 152 including an organic material. The light-emitting layer 152 may further include one or more of: a hole injection layer (HIL), a hole transport layer (HTL), an electron transport layer (ETL), and an electron injection layer (EIL), to increase luminous efficiency.

The second electrode 153 may include a conductive material. The second electrode 153 may have a structure different from the first electrode 151. For example, the second electrode 153 may be a transparent electrode. Thus, in a display device according to an example embodiment of the present disclosure, the light generated by the light-emitting layer 152 may be emitted to the outside through the second electrode 153.

The light-emitting element 150 may be supported by a device substrate 110. The light-emitting element 150 may be on the device substrate 110. For example, the first electrode 151 may be close to the device substrate 110. The device substrate 110 may include an insulating material. For example, the device substrate 110 may include glass and/or plastic. Embodiments are not limited to these examples.

The display panel 100 may further include a thin film transistor 120 between the device substrate 110 and the light-emitting element 150. The thin film transistor 120 may control the light-emitting element 150. For example, the thin film transistor 120 may include a semiconductor pattern 121, a gate insulating layer 122, a gate electrode 123, an interlayer insulating layer 124, a source electrode 125, and a drain electrode 126. The light-emitting element 150 may be electrically coupled to the thin film transistor 120. For example, the first electrode 151 of the light-emitting element 150 may be connected to the drain electrode 126 of the thin film transistor 120.

The semiconductor pattern 121 may be close to the device substrate 110. The semiconductor pattern 121 may include a semiconductor material. For example, the semiconductor pattern 121 may include amorphous silicon or polysilicon. The semiconductor pattern 121 may include an oxide semiconductor material. For example, the semiconductor pattern 121 may include indium gallium zinc oxide (IGZO). Embodiments are not limited to these examples.

The semiconductor pattern 121 may include a source region, a drain region, and a channel region. The channel region may be between the source region and the drain region. The channel region may have conductivity that is relatively lower than the source region and the drain region. For example, the source region and the drain region may have a content of conductive impurities that is higher than the channel region.

The display panel 100 may further include a display buffer layer 105 between the device substrate 110 and the semiconductor pattern 121. The display buffer layer 105 may extend beyond the semiconductor pattern 121. For example, the display buffer layer 105 may entirely cover a surface of the device substrate 110. The display buffer layer 105 may include an insulating material. For example, the display buffer layer 105 may include silicon oxide, although embodiments are not limited thereto.

The gate insulating layer 122 may be on the semiconductor pattern 121. The gate insulating layer 122 may include an insulating material. For example, the gate insulating layer 122 may include silicon oxide and/or silicon nitride. The gate insulating layer 122 may have a multi-layer structure. The gate insulating layer 122 may include a high-K material. For example, the gate insulating layer 122 may include hafnium oxide (HfO) and/or titanium oxide (TiO). Embodiments are not limited to these examples.

The gate electrode 123 may be on the gate insulating layer 122. The gate electrode 123 may overlap the channel region of the semiconductor pattern 121. The gate electrode 123 may be insulated from the semiconductor pattern 121 by the gate insulating layer 122. For example, the gate electrode 123 may include a side surface that may be vertically aligned with a side surface of the gate insulating layer 122. The side surface of the gate insulating layer 122 may be continuous with the side surface of the gate electrode 123.

The gate electrode 123 may include a conductive material. For example, the gate electrode 123 may include a metal, such as aluminum (Al), chrome (Cr), copper (Cu), titanium (Ti), molybdenum (Mo), and/or tungsten (W). The gate electrode 123 may have a multi-layer structure. Embodiments are not limited to these examples.

The interlayer insulating layer 124 may be on the semiconductor pattern 121 and the gate electrode 123. The interlayer insulating layer 124 may extend beyond the semiconductor pattern 121. For example, the interlayer insulating layer 124 may be directly contact the display buffer layer 105 in a periphery of the semiconductor pattern 121. The interlayer insulating layer 124 may include an insulating material. For example, the interlayer insulating layer 124 may include silicon oxide or silicon nitride. Embodiments are not limited to these examples.

The source electrode 125 and the drain electrode 126 may be on the interlayer insulating layer 124. The source electrode 125 may be electrically coupled to the source region of the semiconductor pattern 121. The drain electrode 126 may be electrically coupled to the drain region of the semiconductor pattern 121. For example, the interlayer insulating layer 124 may include a source contact hole exposing the source region of the semiconductor pattern 121, and a drain contact hole exposing the drain region of the semiconductor pattern 121. The drain electrode 126 may be spaced apart from the source electrode 125.

The source electrode 125 and the drain electrode 126 may include a conductive material. For example, the source electrode 125 and the drain electrode 126 may include a metal, such as aluminum (Al), chromium (Cr), copper (Cu), titanium (Ti), molybdenum (Mo), and/or tungsten (W). The drain electrode 126 may include a material that is the same as the source electrode 125. The source electrode 125 may have a multi-layer structure. The drain electrode 126 may have a structure substantially similar to the source electrode 125. For example, the drain electrode 126 may have a multi-layer structure. Embodiments are not limited to these examples.

The display panel 100 may further include a lower passivation layer 130 between the thin film transistor 120 and the light-emitting element 150. The lower passivation layer 130 may reduce or prevent damage to the thin film transistor 120 due to the external moisture and impact. The lower passivation layer 130 may extend beyond the source electrode 125 and the drain electrode 126. For example, the lower passivation layer may directly contact the interlayer insulating layer 124 in a periphery of the source electrode 125 and the drain electrode 126. The lower passivation layer 130 may include a lower contact hole exposing a portion of the drain electrode 126.

The lower passivation layer 130 may include an insulating material. For example, the lower passivation layer 130 may include silicon oxide and/or silicon nitride. The lower passivation layer 130 may have a multi-layer structure. Embodiments are not limited to these examples.

The display panel 100 may further include an overcoat layer 140 between the lower passivation layer 130 and the light-emitting element 150. The overcoat layer 140 may remove (e.g., compensate for) a thickness difference due to the thin film transistor 120. For example, an upper surface of the overcoat layer 140 opposite to the device substrate 110 may be a flat surface. The overcoat layer 140 may include an upper contact hole overlapping the lower contact hole. The first electrode 151 may be electrically coupled to the thin film transistor 120 through the lower contact hole and the upper contact hole.

The overcoat layer 140 may include an insulating material. The overcoat layer 140 may include a material having relatively high fluidity. For example, the overcoat layer 140 may include an organic insulating material, such as photoacryl (PA), although embodiments are not limited thereto.

Each of the light-emitting elements 150 may be driven independently. For example, the display panel 100 may further include a bank insulating layer 160 to insulate between the first electrodes 151 of adjacent light-emitting elements 150. The bank insulating layer 160 may cover an edge of the first electrode 151. The light-emitting layer 152 and the second electrode 153 may be stacked, e.g., sequentially, on a portion of the first electrode 151 that may be exposed by the bank insulating layer 160.

The bank insulating layer 160 may include an insulating material. For example, the bank insulating layer 160 may include an organic insulating material. The bank insulating layer 160 may include a material that is different from that of the overcoat layer 140. For example, the bank insulating layer 160 may include polyimide (PI), although embodiments are not limited thereto.

A touch structure 200 may be on the second electrode 153 of the light-emitting element 150. The touch structure 200 may detect the location of the region that a user's hand or tool may contact. For example, the touch structure 200 may include a first touch electrode assembly 210 extending in a first direction, and a second touch electrode assembly 220 extending in a second direction perpendicular to the first direction.

The first touch electrode assembly 210 may include first touch electrodes 210e and first bridge electrodes 210b. The first touch electrodes 210e may be spaced apart from each other. The first bridge electrodes 210b may be between the first touch electrodes 210e that are adjacent in the first direction. The first bridge electrodes 210b may be a shape extending in the first direction. For example, the first touch electrodes 210e may be connected in the first direction by the first bridge electrodes 210b.

The second touch electrode assembly 220 may include second touch electrodes 220e and second bridge electrodes 220b. The second touch electrodes 220e may be spaced apart from each other. The second touch electrodes 220e may be spaced apart from the first touch electrodes 210e. For example, the second touch electrodes 220e may be between the first touch electrodes 210e. The touch structure 200 of the display device according to an example embodiment of the present disclosure may detect the location of the region that a user's hand or tool may contact by the mutual capacitance between the first touch electrodes 210e and the second touch electrodes 220e.

The second bridge electrodes 220b may be between the second touch electrodes 220e that are adjacent in the second direction. The second bridge electrodes 220b may be a shape extending in the second direction. For example, the second touch electrodes 220e may be connected in the second direction by the second bridge electrodes 220b.

The second bridge electrodes 220b may intersect the first bridge electrodes 210b. The second bridge electrodes 220b may overlap a portion of the first bridge electrodes 210b. The first bridge electrodes 210b may be insulated from the second bridge electrodes 220b. For example, the first bridge electrodes 210b may be on a layer different from the second bridge electrodes 220b. The touch structure 200 may further include a touch insulating layer 230 between the first bridge electrodes 210b and the second bridge electrodes 220b.

The first bridge electrodes 210b may be close to the light-emitting element 150. The second bridge electrodes 220b may be on the touch insulating layer 230. The second bridge electrodes 220b may be directly connected to the second touch electrodes 220e. For example, the first touch electrodes 210e, the second touch electrodes 220e, and the second bridge electrodes 220b may be on the touch insulating layer 230.

The touch structure 200 may further include a touch buffer layer 205 close to the light-emitting element 150. The touch buffer layer 205 may reduce or prevent unnecessary or undesirable connection between the light-emitting element 150 and the touch electrodes 210e and 220e, and between the light-emitting element 150 and the bridge electrodes 210b and 220b. For example, the first bridge electrodes 210b may be between the touch buffer layer 205 and the touch insulating layer 230. The touch buffer layer 205 may include an insulating material. For example, the touch buffer layer 205 may include silicon oxide, although embodiments are not limited thereto.

The touch insulating layer 230 may include touch contact holes 230h to electrically connect the first touch electrodes 210e to the corresponding first bridge electrode 210b. For example, the touch contact holes 230h may expose a portion of each first bridge electrode 210b. Both end portions of each first bridge electrode 210b may be exposed by the touch contact holes 230h. For example, the touch contact holes 230h may overlap end portions of the first bridge electrodes 210b.

The touch structure 200 may further include routing lines 250 connecting each touch assembly 210 and 220 to a corresponding touch pad 240. The routing lines 250 may extend along an edge of the touch structure 200. The touch pads 240 may be on the device substrate 110. For example, the routing lines 250 may extend along an edge of the device substrate 110.

An encapsulating structure 300 may be between the light-emitting element 150 and the touch structure 200. The encapsulating structure 300 may reduce or prevent damage to the light-emitting element 150 due to the external moisture. For example, the encapsulating structure 300 may include a first inorganic encapsulating layer 310, an organic encapsulating layer 320, and a second inorganic encapsulating layer 330, which may be sequentially stacked on the light-emitting element 150. The touch structure 200 may be directly contact the second inorganic encapsulating layer 330.

The first inorganic encapsulating layer 310 and the second inorganic encapsulating layer 330 may include an inorganic insulating material. For example, the first inorganic encapsulating layer 310 and the second inorganic encapsulating layer 330 may include silicon oxide (SiO) and/or silicon nitride (SiN). The first inorganic encapsulating layer 310 and the second inorganic encapsulating layer 330 may include an inorganic insulating material that may be capable of a process of depositing in low temperatures. For example, the first inorganic encapsulating layer 310 and the second inorganic encapsulating layer 330 may include aluminum oxide (AlO), e.g., alumina. The second inorganic encapsulating layer 330 may include a material that is different from the first inorganic encapsulating layer 310. Embodiments are not limited to these examples.

The organic encapsulating layer 320 may include an organic insulating material. For example, the organic encapsulating layer 320 may include an acryl resin, an epoxy resin, polyimide, polyethylene, and/or silicon oxycarbide (SiOC). Thus, in a display device according to an example embodiment of the present disclosure, the stress due to warping may be dispersed. Embodiments are not limited to these examples.

A dam 400 may be on the device substrate 110 to reduce or prevent the expansion of the organic encapsulating layer 320. The dam 400 may be close to the edge of the device substrate 110. The dam 400 may reduce or prevent damage to the touch pads 240 due to the organic encapsulating layer 320. For example, the dam 400 may include a first dam 410 extending along the edge of the device substrate 110, and a second dam 420 crossing between the light-emitting element 150 and the touch pads 240.

A reflecting prevention layer 500 may be between the first bridge electrodes 210b and the touch insulating layer 230. For example, the reflecting prevention layer 500 may be on an upper surface of the first bridge electrodes 210b facing the touch contact holes 230h. A portion of the upper surface of the first bridge electrodes 210b, which may not be exposed by the touch contact holes 230h, may be covered by the reflecting prevention layer 500. The touch contact holes 230h may penetrate the reflecting prevention layer 500.

The reflecting prevention layer 500 may include a black-based material and a binder. The black-based material may be a material for absorbing light. For example, the black-based material may include a carbon black, an organic black, or a metal oxide. The metal oxide may include titanium oxide (TiO). The binder may include a material having a relatively low permittivity. For example, the binder may include acryl, siloxane, and/or polyimide. Thus, a display device according to an example embodiment of the present disclosure may reliably insulate between the first bridge electrodes 210b and the second bridge electrodes 220b by the reflecting prevention layer 500. Therefore, in a display device according to an example embodiment of the present disclosure, the deterioration of the touch sensitivity due to the reflecting prevention layer 500 may be reduced or prevented.

The reflecting prevention layer 500 may overlap a portion of the bank insulating layer 160. The first bridge electrodes 210b may be spaced apart from a portion of the first electrode 151 that is exposed by the bank insulating layer 160. Thus, in a display device according to an example embodiment of the present disclosure, the light emitted from the light-emitting layer 152 may be not blocked by the reflecting prevention layer 500. Therefore, in a display device according to an example embodiment of the present disclosure, the deterioration of the emission efficiency due to the reflecting prevention layer 500 may be reduced or prevented.

A cover substrate 170 may be on the touch structure 200. The cover substrate 170 may reduce or prevent damage to the touch structure 200 due to the external impact and moisture. The cover substrate 170 may include an insulating material. The cover substrate 170 may include a transparent material. For example, the cover substrate 170 may include glass and/or plastic. Embodiments are not limited to these examples.

The touch structure 200 may further include a touch passivation layer 260 that may be on the first touch electrodes 210e, the second touch electrodes 220e, and the second bridge electrodes 220b. The cover substrate 170 may be directly contact the touch passivation layer 260. The cover substrate 170 may be coupled to the device substrate 110, including the light-emitting element 150 and the touch structure 200, by the touch passivation layer 260. The touch passivation layer 260 may include an insulating material. For example, the touch passivation layer 260 may include silicon oxide and/or silicon nitride. Embodiments are not limited to these examples.

FIGS. 4A to 4D are views sequentially showing a method of forming a display device according to an example embodiment of the present disclosure.

Figure 4A:
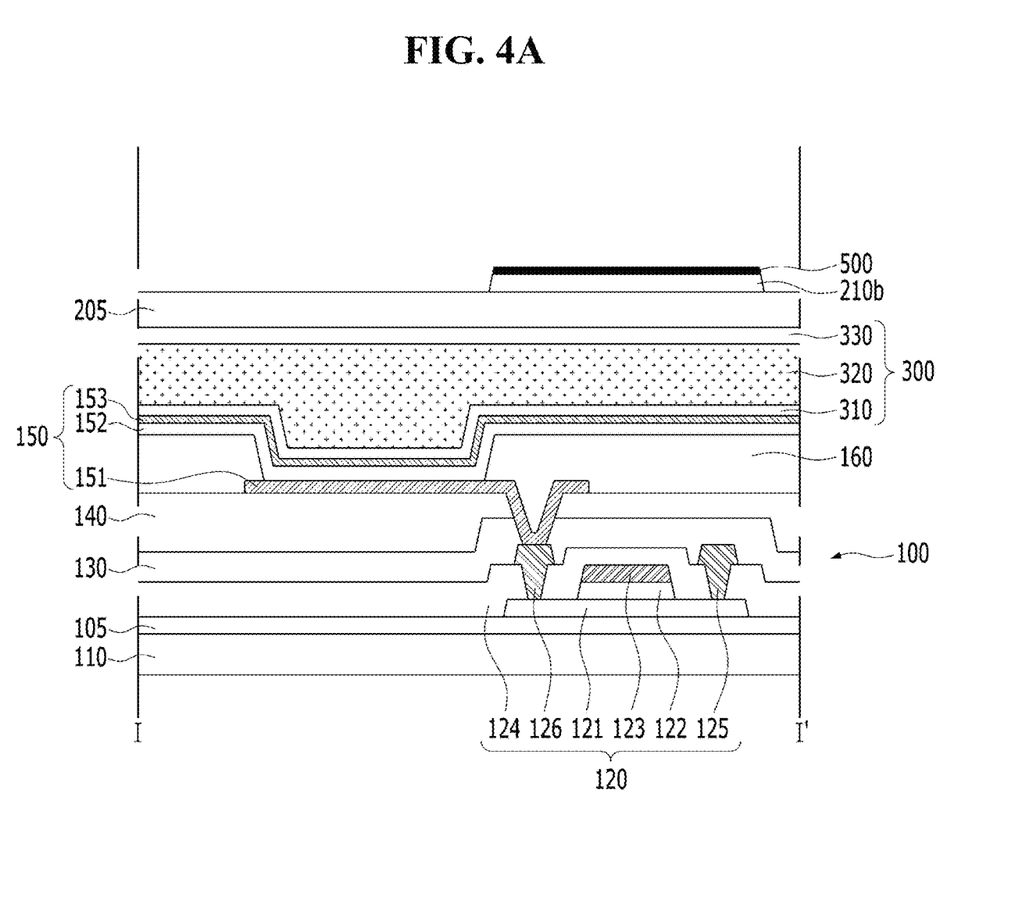
FIGS. 4A to 4D are views sequentially showing a method of forming a display device according to an example embodiment of the present disclosure.

A method of forming the display device according to an example embodiment of the present disclosure will be described with reference to FIGS. 3 to 4D. The method of forming a display device according to an example embodiment of the present disclosure may include an operation of forming the display buffer layer 105 on the device substrate 110, an operation of forming the thin film transistor 120 on the display buffer layer 105, an operation of forming the lower passivation layer 130 on the thin film transistor 120, an operation of forming the overcoat layer 140 on the lower passivation layer 130, an operation of forming the first electrode 151 electrically coupled to the thin film transistor 120, an operation of forming the bank insulating layer 160 covering an edge of the first electrode 151, an operation of forming the light-emitting element 150 by stacking the light-emitting layer 152 and the second electrode 153 on the portion of the first electrode 151 that may be exposed by the bank insulating layer 160, an operation of forming the encapsulating structure 300 on the second electrode 153, an operation of forming a first bridge electrode 210b on the encapsulating structure 300, and an operation of forming the reflecting prevention layer 500 on the first bridge electrode 210b, as shown in the example of FIG. 4A.

The operation of forming the encapsulating structure 300 may include an operation of forming the first inorganic encapsulating layer 310 on the light-emitting element 150, an operation of forming the organic encapsulating layer 320 on the first inorganic encapsulating layer 310, and an operation of forming the second inorganic encapsulating layer 330 on the organic encapsulating layer 320. The second inorganic encapsulating layer 330 may be formed of a material that is different from the first inorganic encapsulating layer 310.

The first bridge electrode 210b and the reflecting prevention layer 500 may be formed by a continuous etching process. For example, the operation of forming the first bridge electrode 210b and the operation of forming the reflecting prevention layer 500 may include an operation of forming a bridge material layer on the encapsulating structure 300, an operation of forming a reflecting prevention material layer on the bridge material layer, an operation of forming the reflecting prevention layer 500 by patterning the reflecting prevention material layer, and an operation of forming the first bridge electrode 210b by removing regions of the bridge material layer that may be exposed by the reflecting prevention layer 500.

The reflecting prevention layer 500 may be formed of the black-based material and the binder having low permittivity. For example, the operation of forming the reflecting prevention material layer may include an operation of depositing a solution, in which the black-based material and the binder may be mixed, on the bridge material layer. The term "black-based material" refers to a material absorbing light. For example, the black-based material may include a carbon black, an organic black, and/or a metal oxide. The metal oxide may include titanium oxide (TiO). The binder may include acryl, siloxane, and/or polyimide. Embodiments are not limited to these examples.

The reflecting prevention layer 500 may be formed on the upper surface of the first bridge electrode 210b opposite to the device substrate 110. The side surface of the first bridge electrode 210b may be continuous with the side surface of the reflecting prevention layer 500. The reflecting prevention layer 500 may include the side surface that may be vertically aligned with the side surface of the first bridge electrode 210b.

Figure 4B:
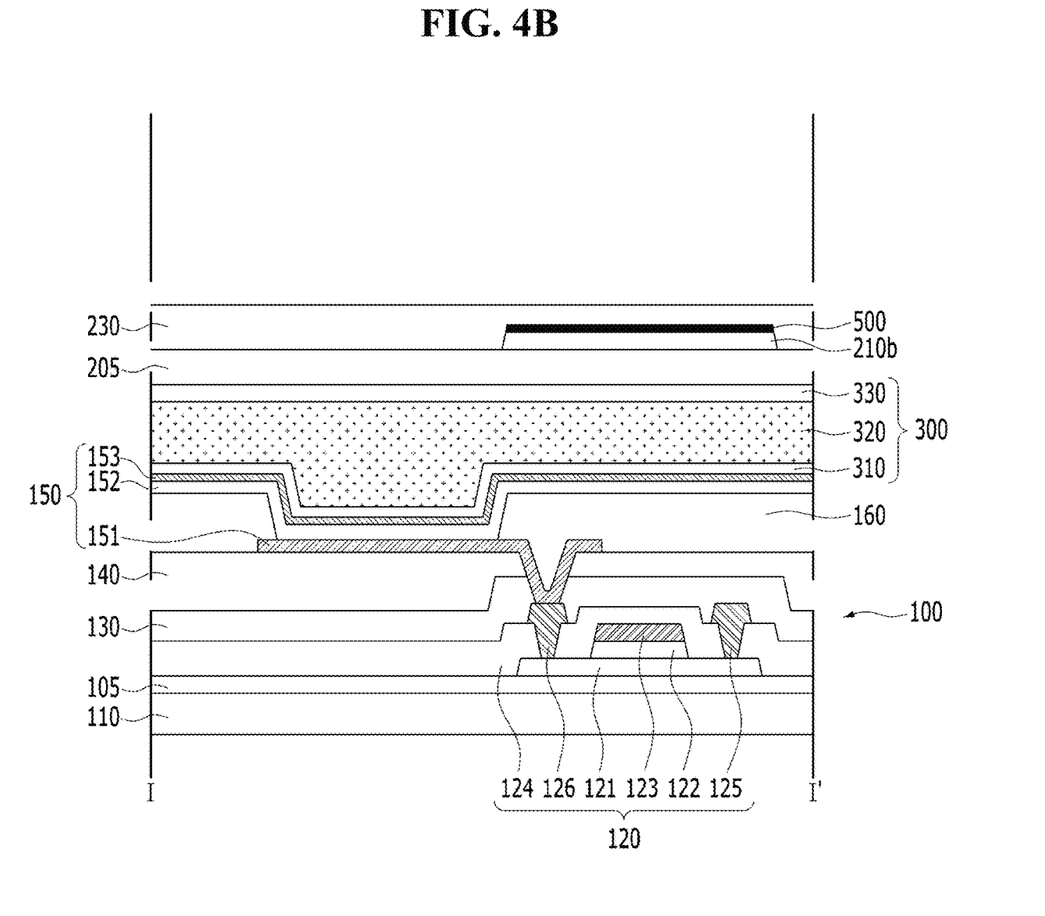

The method of forming the display device according to an example embodiment of the present disclosure may include an operation of forming the touch insulating layer 230 covering the first bridge electrode 210b and the reflecting prevention layer 500, as shown in the example of FIG. 4B. The touch insulating layer may be formed of an insulating material. For example, the touch insulating layer may be formed of silicon oxide and/or silicon nitride. Embodiments are not limited to these examples.

Figure 4C:
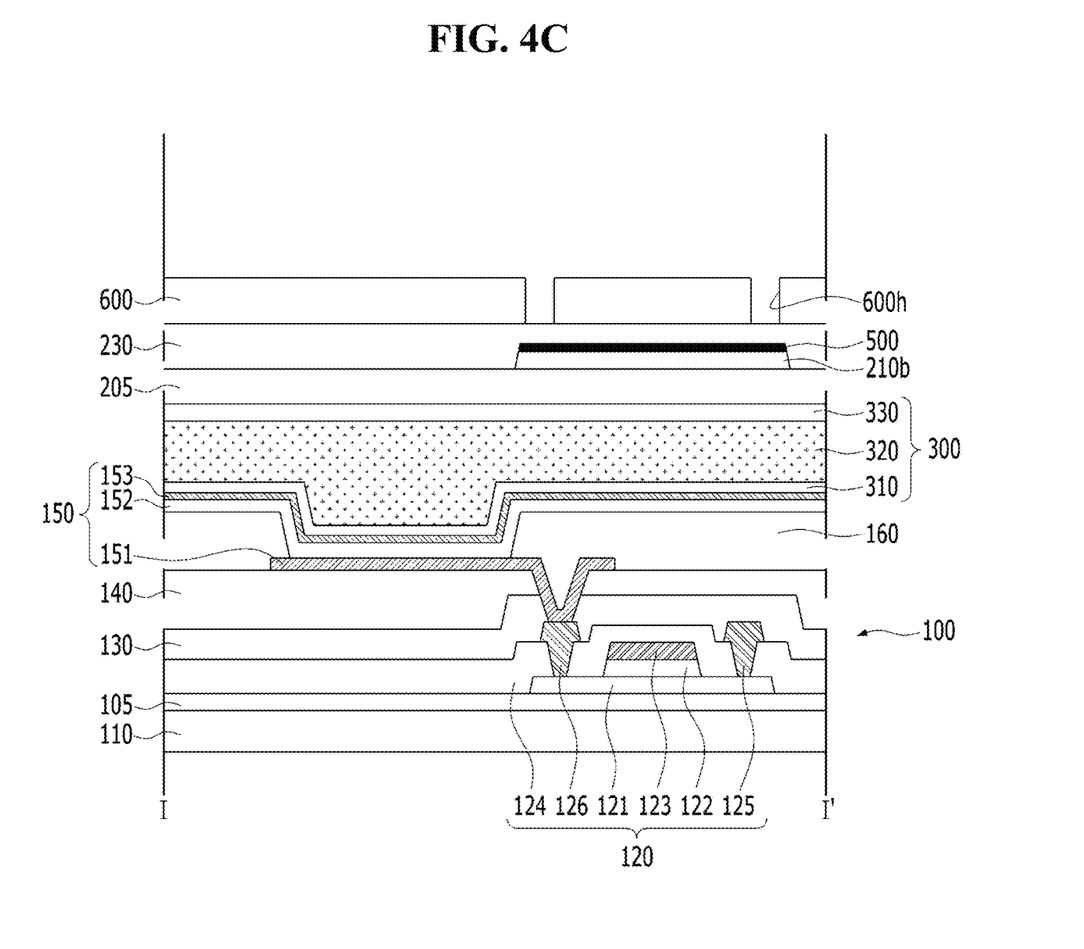

The method of forming the display device according to an example embodiment of the present disclosure may include an operation of forming a mask pattern 600 on the touch insulating layer 230, as shown in the example of FIG. 4C. The mask pattern 600 may include a mask penetrating hole 600h. For example, the operation of forming the mask pattern 600 may include an operation of forming a mask material layer on the touch insulating layer 230, and an operation of forming the mask penetrating hole 600h in the mask material layer.

The operation of forming the mask penetrating hole 600h may include a photolithography process of the mask material layer. For example, the operation of forming the mask penetrating hole 600h may include an operation of irradiating light to a portion of the mask material layer, and an operation of removing regions of the mask material layer in which the light is not irradiated.

In the method of forming the display device according to an example embodiment of the present disclosure, the light traveling toward the first bridge electrode 210b through the touch insulating layer 230 may be blocked by the reflecting prevention layer 500. Thus, in the method of forming the display device according to an example embodiment of the present disclosure, the light irradiated to form the mask penetrating hole 600h may be not reflected by the first bridge electrode 210b. That is, the method of forming the display device according to an example embodiment of the present disclosure may reduce or prevent the exposure of un-design regions (e.g., regions that are not part of the intended design) in the photolithography process of forming the mask penetrating hole 600h. Therefore, in the method of forming the display device according to an example embodiment of the present disclosure, the mask penetrating hole 600h may be formed as designed, e.g., according to the intended design.

Figure 4D:
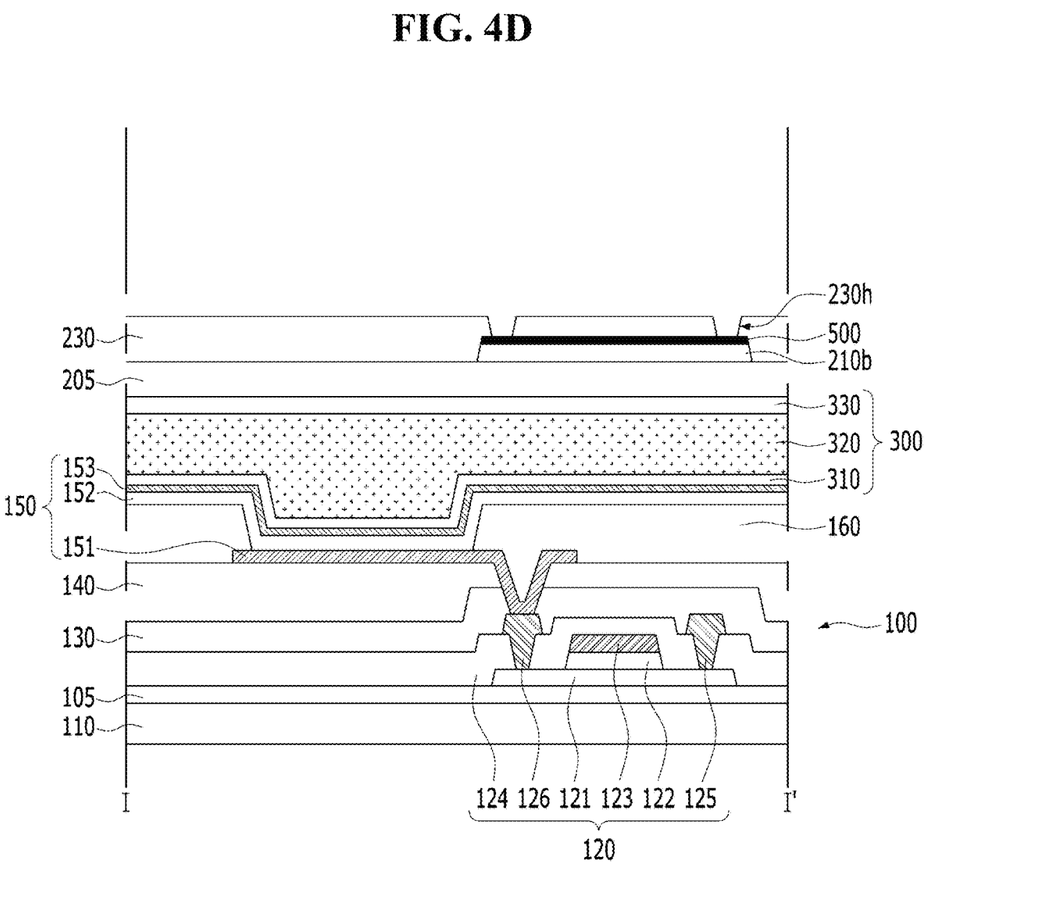

The method of forming the display device according to an example embodiment of the present disclosure may include an operation of forming the touch contact hole 230h in the touch insulating layer 230 using the mask pattern 600, as shown in the example of FIG. 4D. The operation of forming the touch contact hole 230h may include an operation of removing a portion of the touch insulating layer 230 that may be exposed by the mask penetrating hole 600h. Thus, in the method of forming the display device according to an example embodiment of the present disclosure, the touch contact hole 230h may be formed as designed.

The method of forming the display device according to an example embodiment of the present disclosure may include an operation of removing a portion of the reflecting prevention layer 500 that may be exposed by the touch contact hole 230h, an operation of forming the first touch electrodes 210e connected to the first bridge electrode 210b, the second touch electrodes 220e between the first touch electrodes 210e, and the second bridge electrode 220b connected to the second touch electrodes 220e in a second direction, an operation of forming the touch passivation layer 260 covering the first touch electrodes 210e, the second touch electrodes 220e and the second bridge electrode 220b, and an operation of forming the cover substrate 170 on the touch passivation layer 260, as shown in the example of FIG. 3.

The first touch electrodes 210e may be connected to the first bridge electrode 210b through the touch contact hole 230h. Because the touch contact hole 230h is formed as designed by the reflecting prevention layer 500, the first touch electrodes 210e may be stably connected to the first bridge electrode 210b though touch contact hole 230h.

Accordingly, a display device according to an example embodiment of the present disclosure may include the reflecting prevention layer 500 between the first bridge electrodes 210b and the touch insulating layer 230, so that the reflection of the light irradiated to form the touch contact hole 230h in the touch insulating layer 230, e.g., due to the first bridge electrodes 210b, may be reduced or prevented. Thus, in a display device according to an example embodiment of the present disclosure, the touch contact hole 230h may be formed as designed. That is, in a display device according to an example embodiment of the present disclosure, the touch contact holes 230h may completely penetrate the touch insulating layer 230, so that the first touch electrodes 210e may be stably connected to the first bridge electrode 210b. Therefore, in a display device according to an example embodiment of the present disclosure, the reliability of a photolithography process for the location of the contact region detected by the touch electrodes 210e and 220e may be increased.

Table 1 (below) shows the permittivity according to the thickness of the reflecting prevention layer 500 based on experimental results using a display device according to an example embodiment of the present disclosure. Table 2 (below) shows the generation number of the stains according to the thickness of the antireflection film 500 based on experimental results using a display device according to an example embodiment of the present disclosure.

TABLE 1

| | Thickness of the reflection prevention layer (μm) | | | | | |
|---|---|---|---|---|---|---|
| | 0.01 | 0.05 | 0.10 | 0.50 | 1.0 | 2.0 |
| Permittivity | 4.2 | 3.7 | 3.3 | 3.2 | 3.1 | 3.0 |

TABLE 2

| | Thickness of the reflection prevention layer (μm) | | | | | |
|---|---|---|---|---|---|---|
| | 0.1 | 0.5 | 1.0 | 1.5 | 2.0 | 3.0 |
| Number of stains generated | 0 | 1 | 1 | 2 | 3 | 4 |

With reference to Table 1, as the thickness of the reflecting prevention layer 500 is increased, the permittivity is decreased, but the permittivity is hardly changed (e.g., barely or little changed) when the thickness of the reflecting prevention layer 500 is about 0.1 μm or more. With reference to Table 2, when the thickness of the reflection prevention layer 500 is about 1 μm or more, the generation number of the stains is increased. The permittivity of the touch structure may deteriorate the touch sensitivity. Also, when the number of the stains is increased, the quality of the image in which the user recognizes may be decreased. Thus, in a display device according to an example embodiment of the present disclosure, the reflection prevention layer 500 may have a thickness of about 0.1 μm to 1.0 μm so that the degradation of the image quality may be reduced or minimized, and the touch sensitivity may be increased or maximized.

Figure 5:
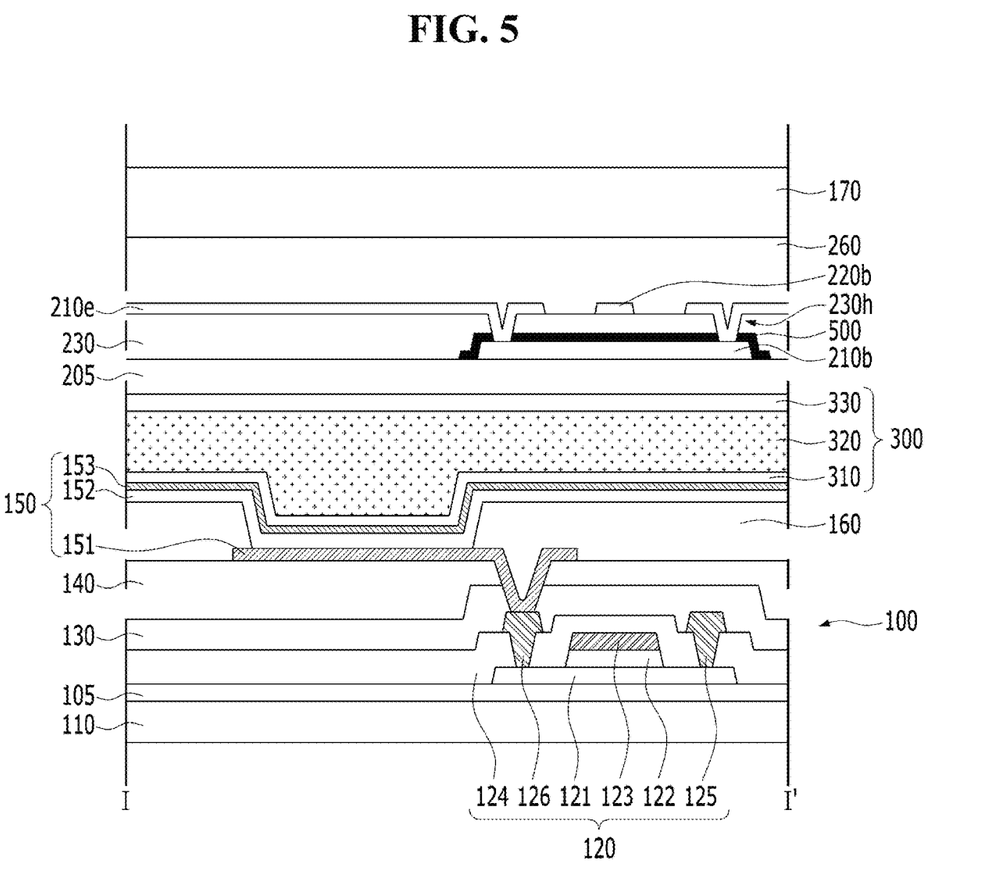
FIGS. 5 and 6 are views respectively showing a display device according to another example embodiment of the present disclosure.
Figure 6:
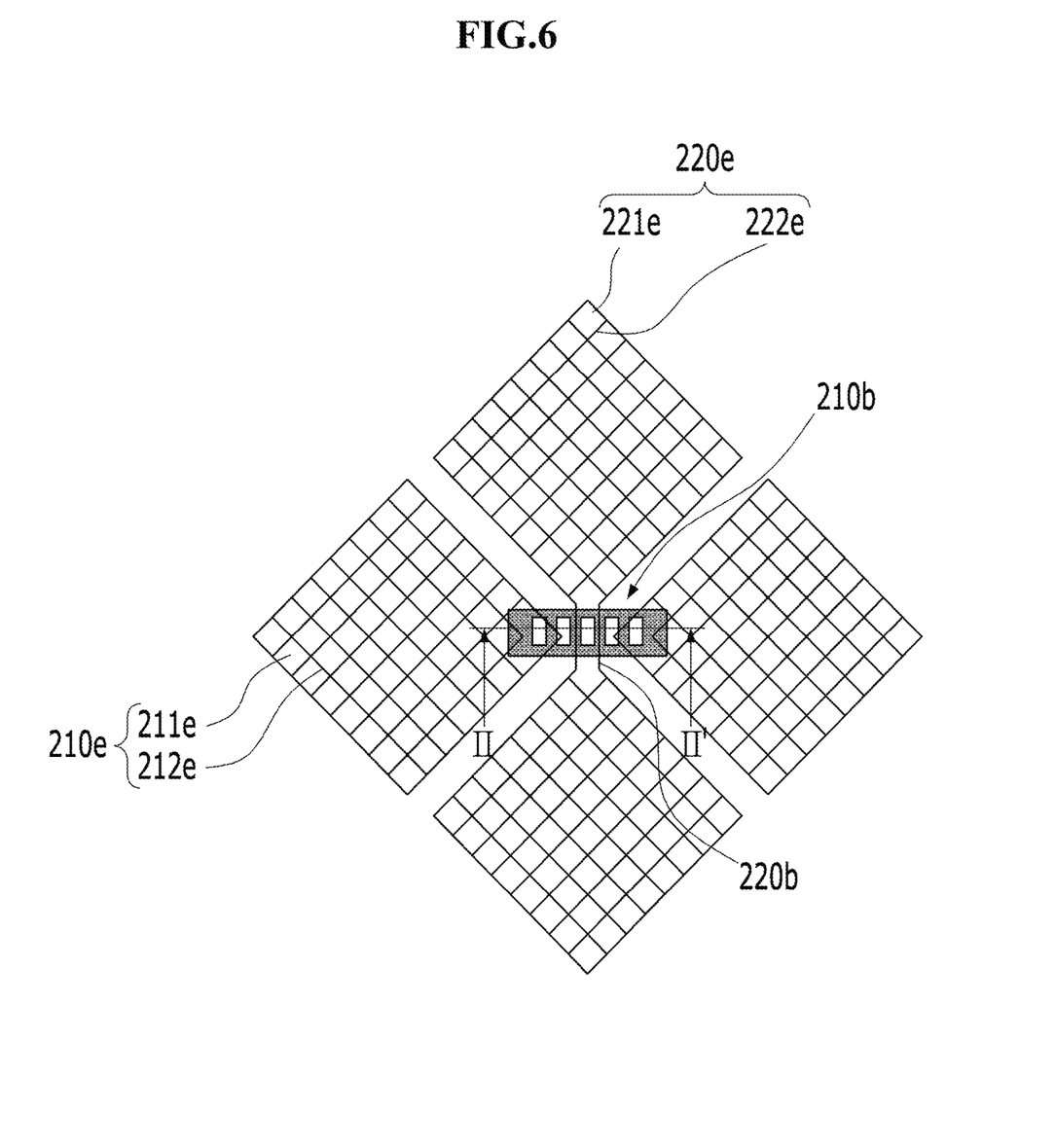
Figure 7:
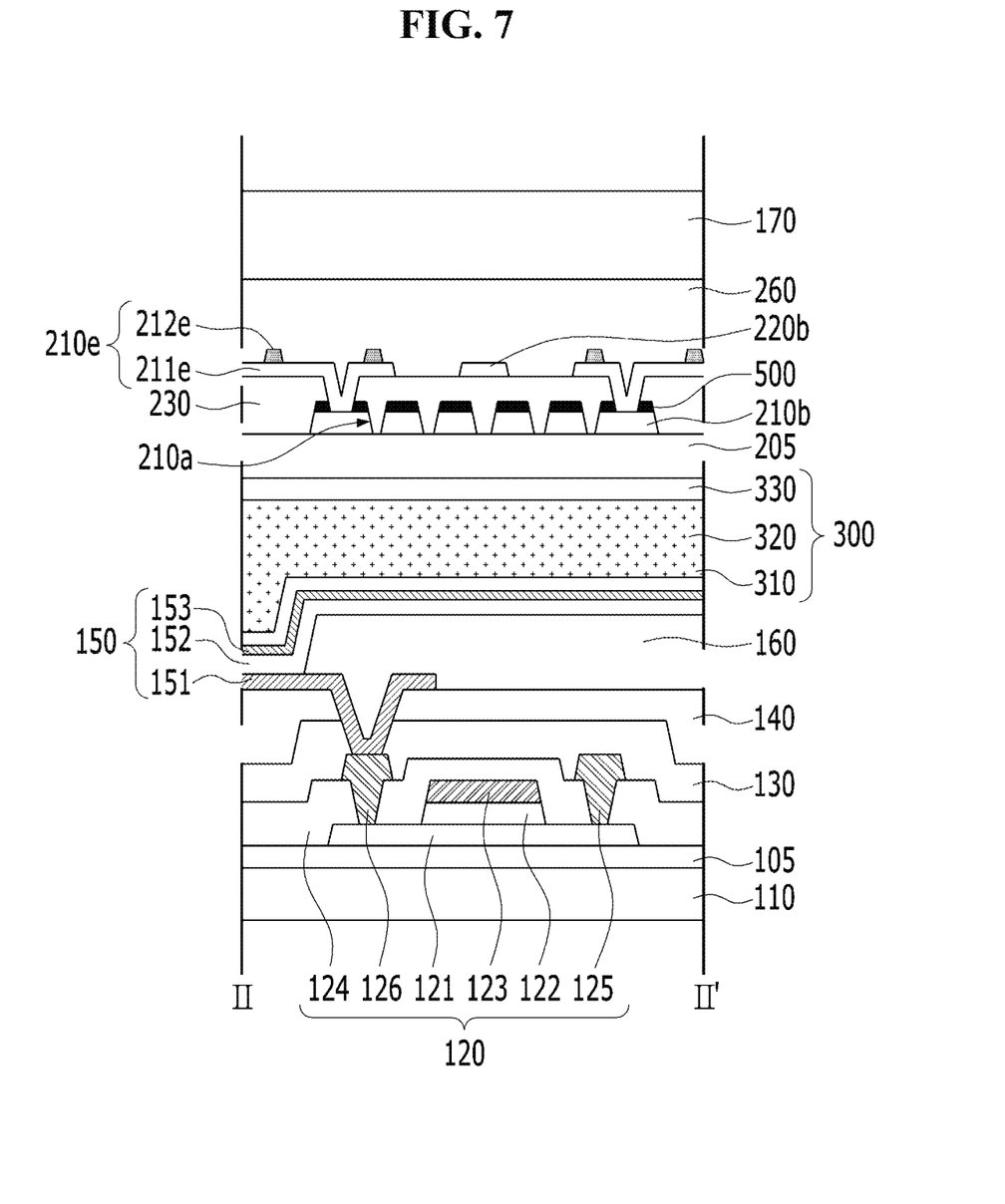
FIG. 7 is a view taken along line II-II' of FIG. 6.

FIGS. 5 and 6 are views respectively showing a display device according to another example embodiment of the present disclosure. FIG. 7 is a view taken along line II-II' of FIG. 6.

In a display device according to an example embodiment of the present disclosure, as described above with reference to the examples of FIGS. 1 to 4D, the reflecting prevention layer 500 may be only on an upper surface of the first bridge electrodes 210b. However, in a display device according to another example embodiment of the present disclosure, the reflecting prevention layer 500 may extend on a side surface of the first bridge electrode 210b, as shown in the example of FIG. 5. Thus, in a display device according to another example embodiment of the present disclosure, the reflection by the side surface of the first bridge electrodes 210b may be reduced or prevented using the reflecting prevention layer 500. Therefore, in a display device according to another example embodiment of the present disclosure, an un-designed (e.g., unintentional) connection between the technical features of the touch structure 200 may be more efficiently avoided or prevented by the reflecting prevention layer 500.

In a display device according to an example embodiment of the present disclosure, as described above with reference to the examples of FIGS. 1 to 4D, the touch electrodes 210e and 220e may have a plate shape. However, in a display device according to another example embodiment of the present disclosure, each of the touch electrodes 210e and 220e may include a transparent touch plate 211 and 212e, and an opaque touch electrodes 212e and 222e of mesh shape on the transparent touch plate 211e and 221e, as shown in the examples of FIGS. 6 and 7. The opaque touch electrodes 212e and 222e may include a material having a resistance that is lower than the transparent touch electrodes 211e and 221e. Thus, in a display device according to another example embodiment of the present disclosure, the decrease of the aperture ratio by the touch electrodes 210e and 220e may be reduced or prevented, and the touch sensitivity may be improved.

In a display device according to an example embodiment of the present disclosure, as described above with reference to the examples of FIGS. 1 to 4D, the first bridge electrodes 210b and the reflecting prevention layer 500 may have a plate shape. However, a display device according to another example embodiment of the present disclosure may include touch penetrating holes 210a penetrating the first bridge electrodes 210b and the reflecting prevention layer 500, as shown in the examples of FIGS. 6 and 7. Thus, in a display device according to another example embodiment of the present disclosure, the decrease of the touch reliability due to the first bridge electrodes 210b may be reduced or prevented, and the aperture ratio and the touch sensitivity may be increased.

As such, a display device according to example embodiments of the present disclosure may reduce or prevent the reflection due to the bridge electrodes in a photolithography process for forming the touch contact hole in the touch insulating layer. That is, a display device according to example embodiments of the present disclosure may reduce or prevent the exposure of the un-design regions (e.g., regions that are not part of the intended design) in the photolithography process. Thus, in a display device according to example embodiments of the present disclosure, the connection between the touch electrode and the bridge electrode may be stable, so that the location of the region that a user's hand or tool may contact may be precisely detected. Therefore, in a display device according to an example embodiments of the present disclosure, the reliability of a signal input through the touch structure may be increased.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A method of forming a display device, the method comprising:
    forming a display buffer layer on a device substrate;
    forming a thin film transistor on the display buffer layer;
    forming a lower passivation layer on the thin film transistor;
    forming an overcoat layer on the lower passivation layer;
    forming a first electrode to be electrically coupled to the thin film transistor;
    forming the bank insulating layer to be covering an edge of the first electrode, such that a portion of the first electrode is exposed by the bank insulating layer;
    forming a light-emitting element by stacking a light-emitting layer and a second electrode on the portion of the first electrode that is exposed by the bank insulating layer;
    forming an encapsulating structure on the second electrode;
    forming a first bridge electrode on the encapsulating structure; and
    forming a reflecting prevention layer on the first bridge electrode,
    wherein the forming the first bridge electrode and the forming the reflecting prevention layer comprises:
    forming a bridge material layer on the encapsulating structure;
    forming a reflecting prevention material layer on the bridge material layer;
    forming the reflecting prevention layer by patterning the reflecting prevention material layer, such that regions of the bridge material layer are exposed by the reflecting prevention layer; and
    forming the first bridge electrode by removing regions of the bridge material layer that are exposed by the reflecting prevention layer.

2. The method of claim 1, wherein the forming the encapsulating structure comprises:
    forming a first inorganic encapsulating layer on the light-emitting element;
    forming an organic encapsulating layer on the first inorganic encapsulating layer; and
    forming a second inorganic encapsulating layer on the organic encapsulating layer.

3. The method of claim 1, wherein the forming the reflecting prevention material layer further comprises depositing a solution, comprising a mixture of a black-based material and a binder, on the bridge material layer.

4. The method of claim 1, wherein the reflecting prevention layer is formed on the upper surface of the first bridge electrode opposite to the device substrate.

5. The method of claim 1, wherein a side surface of the first bridge electrode is continuous with a side surface of the reflecting prevention layer.

6. The method of claim 1, wherein the reflecting prevention layer comprises a side surface that is vertically aligned with a side surface of the first bridge electrode.

7. The method of claim 1, further comprising forming a touch insulating layer covering the first bridge electrode and the reflecting prevention layer.

8. The method of claim 7, further comprising forming a mask pattern on the touch insulating layer.

9. The method of claim 8, wherein the forming the mask pattern comprises:
    forming a mask material layer on the touch insulating layer; and
    forming a mask penetrating hole in the mask material layer.

10. The method of claim 9, wherein forming the mask penetrating hole comprises:
    irradiating light to a portion of the mask material layer; and
    removing regions of the mask material layer in which the light is not irradiated.

11. The method of claim 8, further comprising forming a touch contact hole in the touch insulating layer using the mask pattern.

12. The method of claim 11, further comprising:
    removing a portion of the reflecting prevention layer that is exposed by the touch contact hole;
    forming the first touch electrodes to be connected to the first bridge electrode, second touch electrodes between the first touch electrodes, and a second bridge electrode connected to the second touch electrodes in a second direction,
    forming a touch passivation layer covering the first touch electrodes, the second touch electrodes, and the second bridge electrode, and
    forming a cover substrate on the touch passivation layer.

13. The method of claim 11, wherein the first touch electrodes are connected to the first bridge electrode through the touch contact hole.

* * * * *